(12) United States Patent  
Aida

(10) Patent No.: US 11,754,388 B2  
(45) Date of Patent: Sep. 12, 2023

(54) HEIGHT MEASURING DEVICE, CHARGED PARTICLE BEAM APPARATUS, AND HEIGHT MEASURING METHOD

(71) Applicant: JEOL Ltd., Tokyo (JP)

(72) Inventor: Yukinori Aida, Tokyo (JP)

(73) Assignee: JEOL Ltd., Tokyo (JP)

( * ) Notice: Subject to any disclaimer, the term of this patent is extended or adjusted under 35 U.S.C. 154(b) by 292 days.

(21) Appl. No.: 17/140,302

(22) Filed: Jan. 4, 2021

(65) Prior Publication Data

US 2021/0207945 A1 Jul. 8, 2021

(30) Foreign Application Priority Data

Jan. 7, 2020 (JP) .................................. 2020-000798

(51) Int. Cl.
*H01J 37/20* (2006.01)
*H01J 37/30* (2006.01)
(Continued)

(52) U.S. Cl.
CPC .......... *G01B 11/0608* (2013.01); *H01J 37/20* (2013.01); *H01J 37/3007* (2013.01); (Continued)

(58) Field of Classification Search
CPC .... H01J 37/20; H01J 37/3007; H01J 37/3174; H01J 2237/032; H01J 2237/063; H01J 2237/10; G01B 11/0675
See application file for complete search history.

(56) References Cited

U.S. PATENT DOCUMENTS 5,654,903 A * 8/1997 Reitman .............. G05B 13/027
  700/121
6,031,615 A * 2/2000 Meeks ................. G01B 11/065
  356/600
(Continued)

FOREIGN PATENT DOCUMENTS

JP 2005265841 A 9/2005
JP 2006216834 A 8/2006
(Continued)

OTHER PUBLICATIONS

Extended European Search Report issued in EP20213469.8 dated Jun. 2, 2021.
(Continued)

*Primary Examiner* — Sean M Luck
(74) *Attorney, Agent, or Firm* — THE WEBB LAW FIRM

(57) ABSTRACT

A height measuring device includes a light source that emits light in a direction oblique to a top surface of a specimen, a slit that shapes the light from the light source to form a slit image on the specimen, an imaging element that detects reflected light reflected by the specimen, and an arithmetic unit. The arithmetic unit: identifies a slit image of the reflected light reflected by the top surface of the specimen from among a plurality of slit images based on respective positions of the plurality of slit images on a detection surface of the imaging element; and determines the height of the top surface of the specimen based on the position of the slit image of the reflected light reflected by the top surface of the specimen on the detection surface.

4 Claims, 5 Drawing Sheets

(51) Int. Cl.
*H01J 37/317* (2006.01)
*G01B 11/06* (2006.01)

(52) U.S. Cl.
CPC ..... *H01J 37/3174* (2013.01); *H01J 2237/032* (2013.01); *H01J 2237/063* (2013.01); *H01J 2237/10* (2013.01); *H01J 2237/15* (2013.01); *H01J 2237/202* (2013.01)

(56) References Cited

U.S. PATENT DOCUMENTS

| | | | | |
|---|---|---|---|---|
| 6,104,486 | A * | 8/2000 | Arimoto | G01B 11/02 356/310 |
| 6,271,047 | B1 * | 8/2001 | Ushio | B24B 49/04 451/6 |
| 7,859,659 | B2 * | 12/2010 | Xu | G01N 21/95607 356/73 |
| 9,222,834 | B2 * | 12/2015 | Den Boef | G03F 7/70633 |
| 2007/0109557 | A1 * | 5/2007 | Saito | H01J 37/20 356/602 |
| 2020/0033115 | A1 * | 1/2020 | Bezold | G01B 11/0625 |

FOREIGN PATENT DOCUMENTS

| | | |
|---|---|---|
| JP | 2013228264 A | 11/2013 |
| KR | 1020160002104 A | 1/2016 |

OTHER PUBLICATIONS

Computer-generated English-language translation of JP2006216834, cited in IDS previously filed on Jan. 4, 2021.
Office Action issued in JP2020000798 dated Nov. 16, 2021.

* cited by examiner

HEIGHT MEASURING DEVICE, CHARGED PARTICLE BEAM APPARATUS, AND HEIGHT MEASURING METHOD

CROSS-REFERENCE TO RELATED APPLICATION

This application claims priority to Japanese Patent Application No. 2020-000798 filed Jan. 7, 2020, the disclosure of which is hereby incorporated by reference in its entirety.

BACKGROUND OF THE INVENTION

Field of the Invention

The present invention relates to a height measuring device, a charged particle beam apparatus, and a height measuring method.

Description of Related Art

In an electron beam lithography apparatus, to implement high-accuracy drawing, a height of a top surface of a material is measured before drawing is performed.

For example, JP-A-2006-216834 discloses a height measuring method to be implemented in an electron beam lithography apparatus including a light source, a slit that receives light from the light source, a projection lens that projects the light having passed through the slit, a light receiving lens that receives the light from the projection lens, and a photoelectric conversion means that converts the light from the light receiving lens into an electric signal.

In the height measuring method disclosed in JP-A-2006-216834, a slit image is formed, first, on a top surface of a material by the projection lens and then on the photoelectric conversion means by the light receiving lens, whereby the slit image is formed. Then, a position of a center of gravity of the slit image is detected in the resulting image, and a height of the top surface of the material is determined based on a change in the position of the slit image.

When a height of a top surface of a transparent material, which transmits light from a slight source, is measured in the electron beam lithography apparatus as described above, a slit image of the reflected light reflected by the top surface of the material and a slit image of the reflected light reflected by a back surface of the material are detected. In this case, when the two slit images cannot be distinguished from each other and the height of the top surface of the material is determined based on the position of the slit image of the reflected light reflected by the back surface of the material, the height of the top surface of the material cannot accurately be measured.

SUMMARY OF THE INVENTION

According to a first aspect of the invention, there is provided a height measuring device including:

a light source that emits light in a direction oblique to a top surface of a specimen;

a slit that shapes the light from the light source to form a slit image on the specimen;

an imaging element that detects reflected light reflected by the specimen; and an arithmetic unit that determines a height of the top surface of the specimen based on a result of detection of the slit image by the imaging element, the arithmetic unit performing processing of:

identifying, when a plurality of slit images are detected by the imaging element, a slit image of the reflected light reflected by the top surface of the specimen from among the plurality of slit images based on respective positions of the plurality of slit images on a detection surface of the imaging element; and determining the height of the top surface of the specimen based on the position of the slit image of the reflected light reflected by the top surface of the specimen on the detection surface.

According to a second aspect of the invention, there is provided a charged particle beam apparatus including the height measuring device described above.

According to a third aspect of the invention, there is provided a height measuring method including:

forming a slit image on a top surface of a specimen by using a light source that emits light in a direction oblique to the top surface of the specimen and a slit that shapes the light from the light source;

detecting reflected light reflected by the specimen by using an imaging element;

identifying, when a plurality of slit images are detected by the imaging element, a slit image of the reflected light reflected by the top surface of the specimen from among the plurality of slit images based on respective positions of the plurality of slit images on a detection surface of the imaging element; and determining a height of the top surface of the specimen based on the position of the slit image of the reflected light reflected by the top surface of the specimen on the detection surface.

DESCRIPTION OF THE INVENTION

Figure 1:
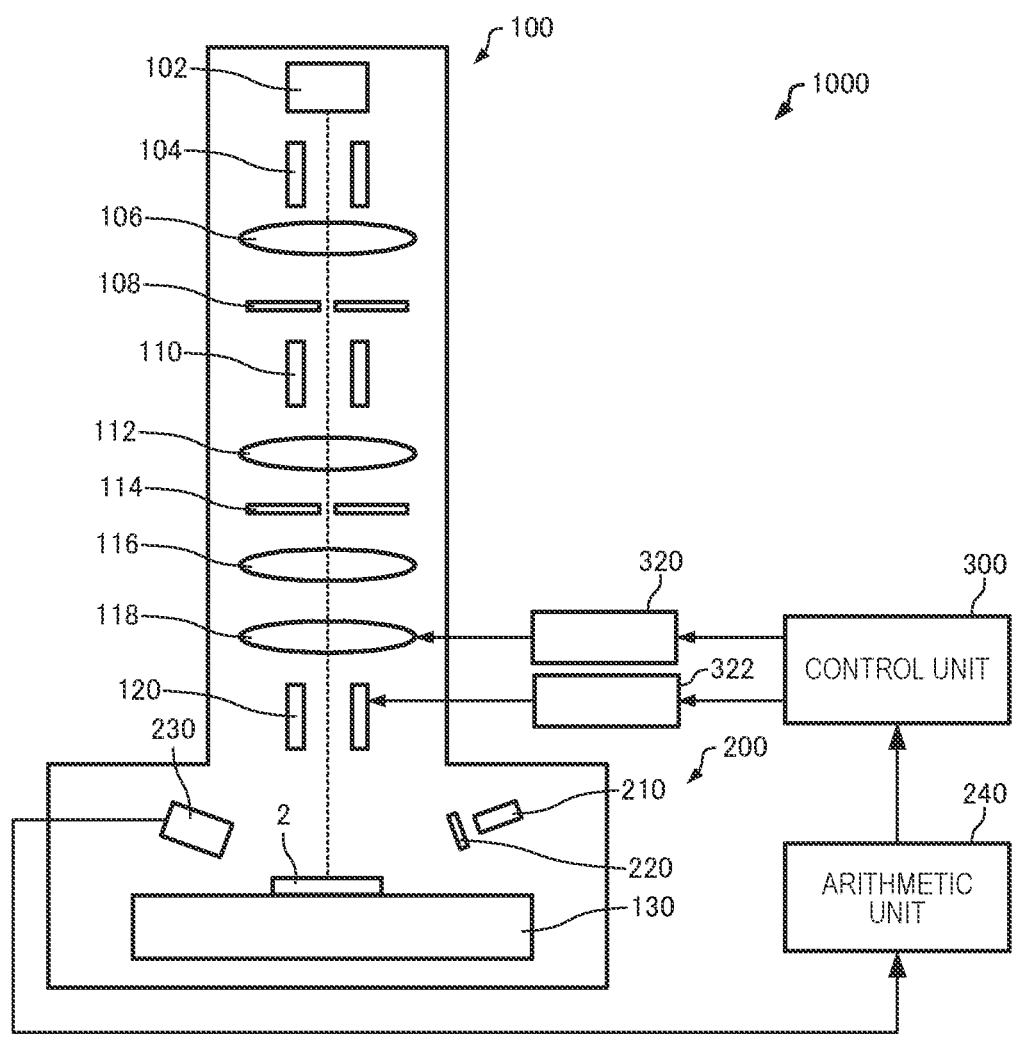
FIG. 1 is a diagram illustrating a configuration of an electron beam lithography apparatus according to an embodiment of the invention.

A height measuring device according to an embodiment of the invention includes: a light source that emits light in a direction oblique to a top surface of a specimen;

a slit that shapes the light from the light source to form a slit image on the specimen;

an imaging element that detects reflected light reflected by the specimen; and an arithmetic unit that determines a height of the top surface of the specimen based on a result of detection of the slit image by the imaging element, the arithmetic unit performing processing of:

identifying, when a plurality of slit images are detected by the imaging element, a slit image of the reflected light reflected by the top surface of the specimen from among the plurality of slit images based on respective positions of the plurality of slit images on a detection surface of the imaging element; and determining the height of the top surface of the specimen based on the position of the slit image of the reflected light reflected by the top surface of the specimen on the detection surface.

In such a height measuring device, when a plurality of slit images are detected by an imaging element, the slit image of reflected light reflected by a top surface of a specimen can be identified. This prevents a height of the top surface of the specimen from being determined based on a slit image of the reflected light reflected by a back surface of the specimen and allows the height of the top surface of the specimen to be accurately measured.

A charged particle beam apparatus according to an embodiment of the invention includes the height measuring device described above.

Such a charged particle beam apparatus allows a height of a top surface of a specimen to be accurately measured.

A height measuring method according to an embodiment of the invention includes:

forming a slit image on a top surface of a specimen by using a light source that emits light in a direction oblique to the top surface of the specimen and a slit that shapes the light from the light source;

detecting reflected light reflected by the specimen by using an imaging element;

identifying, when a plurality of slit images are detected by the imaging element, a slit image of the reflected light reflected by the top surface of the specimen from among the plurality of slit images based on respective positions of the plurality of slit images on a detection surface of the imaging element; and determining a height of the top surface of the specimen based on the position of the slit image of the reflected light reflected by the top surface of the specimen on the detection surface.

In such a height measuring method, when a plurality of slit images are detected by an imaging element, the slit image of reflected light reflected by a top surface of a specimen can be identified. This prevents a height of the top surface of the specimen from being determined based on a slit image of the reflected light reflected by a back surface of the specimen and allows the height of the top surface of the specimen to be accurately measured.

Preferred embodiments of the invention are described in detail below with reference to the drawings. It is noted that the following embodiments do not unduly limit the scope of the invention as stated in the claims. In addition, all of the elements described below are not necessarily essential requirements of the invention.

The following will describe an electron beam lithography apparatus as an example of the charged particle beam apparatus according to the invention, but the charged particle beam apparatus according to the invention is not limited to the electron beam lithography apparatus.

1. Configuration of Electron Beam Lithography Apparatus

With reference to the drawings, a description will be given first of an electron beam lithography apparatus according to an embodiment of the invention. FIG. 1 is a diagram illustrating a configuration of an electron beam lithography apparatus 1000 according to the present embodiment.

The electron beam lithography apparatus 1000 is an apparatus which irradiates a specimen 2 with an electron beam to draw a pattern on the specimen 2. The electron beam lithography apparatus 1000 is an apparatus which draws an extremely fine pattern, such as a semiconductor integrated circuit pattern, on a substrate such as, e.g., a semiconductor substrate or a mask blank. The specimen 2 mentioned herein is, e.g., a substrate such as a semiconductor substrate or a mask blank.

The electron beam lithography apparatus 1000 includes an electro-optical system 100, a height measuring device 200, and a control unit 300.

1.1. Electro-Optical System

The electro-optical system 100 includes an electron gun 102, a blanker 104, an irradiation lens 106, a first slit 108, a shaping deflector 110, a shaping lens 112, a second slit 114, a reduction lens 116, an objective lens 118, and a positioning deflector 120.

The electron gun 102 generates an electron beam. The blanker 104 deflects the electron beam emitted from the electron gun 102 to adjust a time required by the electron beam to pass through the first slit 108. In other words, it is possible to adjust an amount of the electron beam applied to the specimen 2 by using the blanker 104. The electron beam having passed through the blanker 104 is applied to the first slit 108 via the irradiation lens 106.

The first slit 108, the shaping deflector 110, the shaping lens 112, and the second slit 114 shape the electron beam. An image formed by the passage of the electron beam through the first slit 108 is formed over the second slit 114 by the shaping lens 112. At this time, by deflecting the electron beam with the shaping deflector 110, it is possible to change a position of the image formed by the first slit 108 over the second slit 114. Thus, the electron beam can be shaped. By controlling a direction in which the electron beam is deflected and an amount of the deflection of the electron beam in the shaping deflector 110, the electron beam can be shaped into any shape.

The reduction lens 116 reduces the image formed by the first slit 108, the shaping deflector 110, the shaping lens 112, and the second slit 114. The objective lens 118 forms the image reduced by the reduction lens 116 onto the specimen 2. The positioning deflector 120 deflects the electron beam having passed through the objective lens 118. Thus, it is possible to change a position of the electron beam irradiating the specimen 2. In other words, the positioning deflector 120 can determine the position of the image formed by the first slit 108 and the like on the specimen 2.

The electron beam lithography apparatus 1000 has a specimen stage 130 for supporting the specimen 2. The specimen stage 130 includes a moving mechanism for moving the specimen 2.

The electron beam lithography apparatus 1000 can shape the electron beam by using the first slit 108, the shaping deflector 110, the shaping lens 112, and the second slit 114 and control a cross-sectional shape of the electron beam to be applied to the specimen 2, i.e., a shot shape and a shot size. The electron beam lithography apparatus 1000 can also control a time during which the electron beam irradiates the specimen 2, i.e., a shot time by using the blanker 104. In addition, the electron beam lithography apparatus 1000 can control a position of the electron beam irradiating the specimen 2, i.e., a shot position, by using the positioning deflector 120.

1.2. Height Measuring Device

Figure 2:
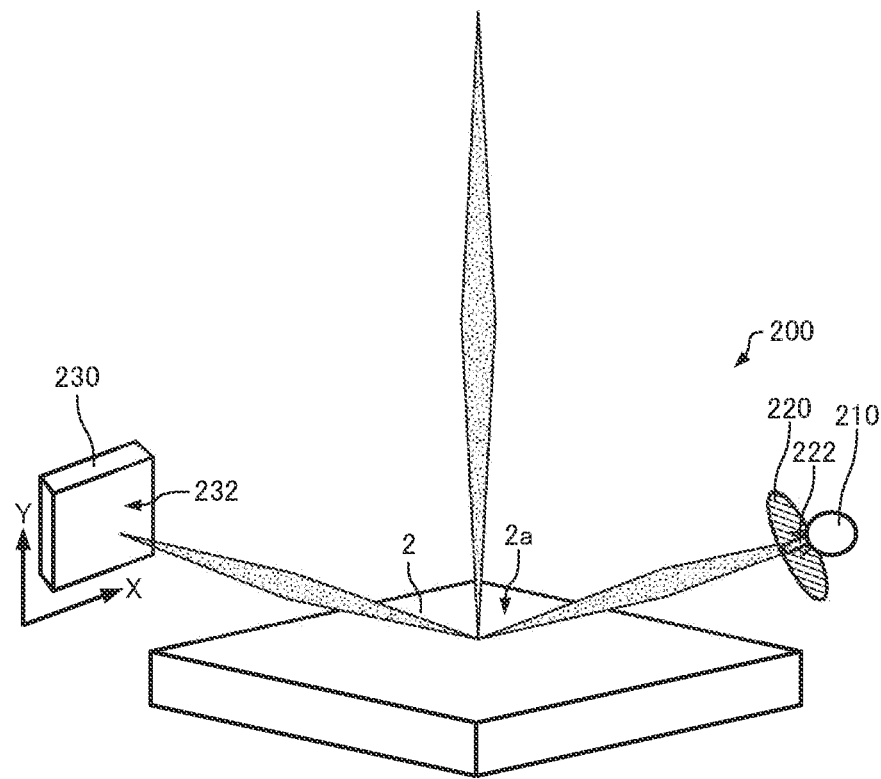
FIG. 2 is a diagram schematically illustrating a configuration of a height measuring device.

FIG. 2 is a diagram schematically illustrating a configuration of a height measuring device 200.

As illustrated in FIGS. 1 and 2, the height measuring device 200 includes a light source 210, a slit member 220 provided with a slit 222, an imaging element 230, and an arithmetic unit 240.

The light source 210 emits light in a direction oblique to a top surface 2a of the specimen 2. The light source 210 illuminates the slit member 220. The light source 210 is a light emitting diode (LED). For example, the light source 210 is an infrared light emitting diode. For example, the light source 210 is the light emitting diode having a wavelength range of not less than 850 nm and not more than 950 nm and a peak wavelength of 870 nm.

In the slit member 220, the slit 222 is formed to allow the light from the light source 210 to pass therethrough. The light having passed through the slit 222 irradiates the top surface 2a of the specimen 2. As a result, a slit image is formed on the top surface 2a of the specimen 2. Note that, between the slit member 220 and the specimen 2, a lens included in an illumination optical system may also be disposed, though not shown. The illumination optical system allows the slit image formed by the slit 222 to be formed on the top surface 2a of the specimen 2.

The imaging element 230 detects the reflected light reflected by the specimen 2. For example, the imaging element 230 is a digital camera such as a charge coupled device (CCD) camera or a complementary metal oxide semiconductor (CMOS) camera. Note that, between the specimen 2 and the imaging element 230, an image forming optical system may also be disposed, though not shown. The image forming optical system allows the slit image on the specimen 2 to be formed on a detection surface 232 of the imaging element 230.

The imaging element 230 can obtain an image including the slit image as a result of the detection of the slit image. In an image photographed by the imaging element 230, a brightness of the slit image is higher than that of the other portion.

The arithmetic unit 240 performs processing of determining a height of the top surface 2a of the specimen 2 based on the result of the detection of the slit image by the imaging element 230. For example, the arithmetic unit 240 includes a processor such as a central processing unit (CPU) and a storage device including a random access memory (RAM), a read only memory (ROM), and the like. In the storage device, programs for performing various calculation processing and data are stored. A function of the arithmetic unit 240 can be implemented through execution of the programs by the processor.

Figure 3:
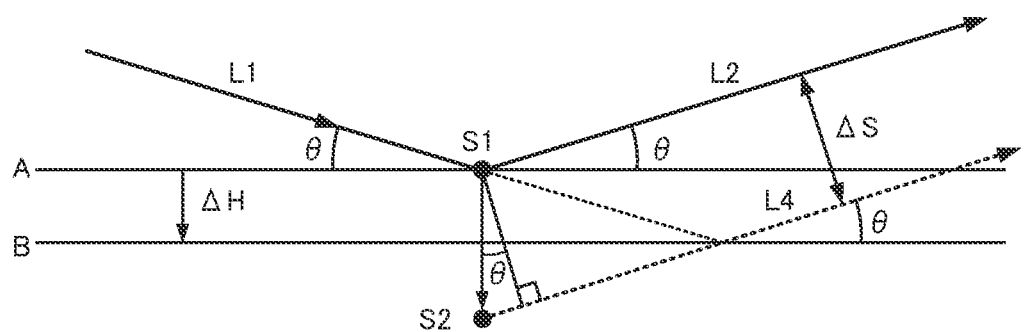
FIG. 3 is a diagram for explaining a principle of height measurement.

FIG. 3 is a diagram for explaining a principle of height measurement.

As illustrated in FIG. 3, it is assumed that 0 represents an incidence angle of an optical axis L1 of the light incident on the top surface of the specimen. When the top surface of the specimen is at a position A, an optical axis of the light regularly reflected by the top surface of the specimen corresponds to an optical axis L2 illustrated in FIG. 3. When the top surface of the specimen is at a position B, the optical axis of the light regularly reflected by the top surface of the specimen corresponds to an optical axis L4 illustrated in FIG. 3. When the top surface of the specimen is at the position A, a slit image S1 on the top surface of the specimen is enlarged by the image forming optical system to be formed on the detection surface of the imaging element. When the top surface of the specimen is at the position B, a slit image S2 is enlarged by the image forming optical system to be formed on the detection surface of the imaging element. The slit image S2 is a mirror image of the slit image S1 with respect to the top surface of the specimen.

When it is assumed that a height variation from the position A to the position B is $\Delta H$ and a magnification of the image forming optical system is M, a displacement amount $\Delta S$ between respective positions of the slit images on the detection surface of the imaging element is given by Expression (1) shown below.

$$\Delta S = 2M \cdot \Delta H \cdot \cos \theta \quad (1)$$

Accordingly, the height variation $\Delta H$ of the top surface of the specimen is given by Expression (2) shown below.

$$\Delta H = \Delta S / (2M \cdot \cos \theta) \quad (2)$$

Accordingly, by measuring the displacement amount $\Delta S$ between the respective positions of the slit images on the detection surface of the imaging element, it is possible to determine the height variation $\Delta H$ of the top surface of the specimen by using Expression (2) shown above.

Figure 4:
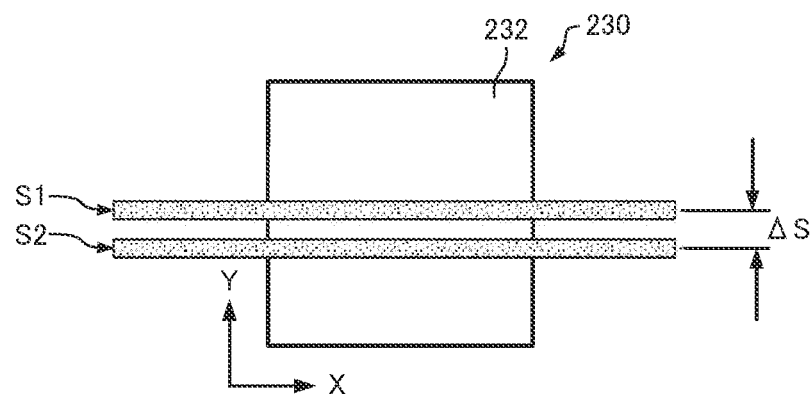
FIG. 4 is a diagram for explaining a technique of measuring a displacement amount ΔS.

FIG. 4 is a diagram for explaining a method of measuring the displacement amount $\Delta S$.

As illustrated in FIG. 4, it is possible to measure the displacement amount $\Delta S$ between the position of the slit image S1 and the position of the slit image S2 on the detection surface 232 of the imaging element 230. In the illustrated example, on the detection surface 232 of the imaging element 230, a Y-axis direction corresponds to a height direction of the top surface 2a of the specimen 2, while an X-axis direction corresponds to a width direction of each of the slit images. Accordingly, by measuring, e.g., a distance in the Y-axis direction between a position of a center (center of gravity) of the slit image S1 and a position of a center (center of gravity) of the slit image S2, it is possible to measure the displacement amount $\Delta S$.

As described above, on the detection surface 232 of the imaging element 230, the Y-axis direction corresponds to the height of the top surface 2a of the specimen 2. Specifically, on the detection surface 232, as a Y-coordinate is larger, the height of the top surface 2a of the specimen 2 is larger. Since a Y-coordinate of the center of the slit image S1 is larger than a Y-coordinate of the center of the slit image S2, the top surface 2a of the specimen 2 when the slit image S1 is detected is higher than the top surface 2a of the specimen 2 when the slit image S2 is detected.

Figure 5:
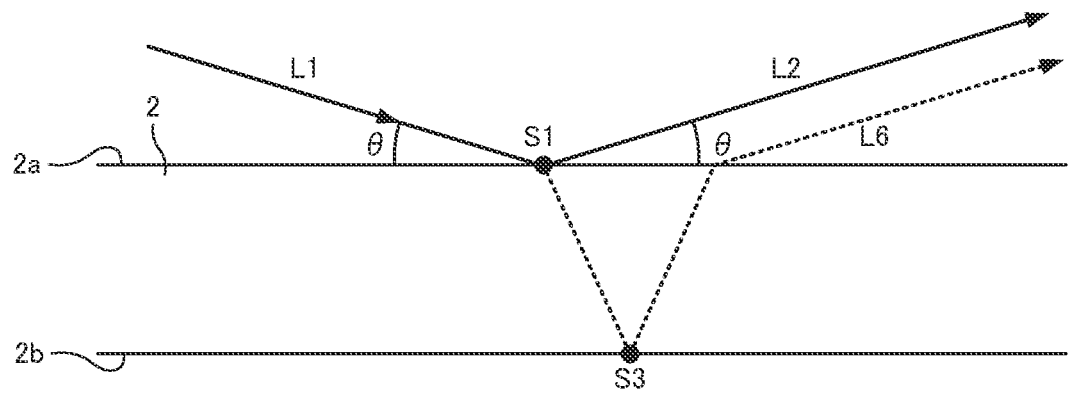
FIG. 5 is a diagram for explaining a technique of identifying, when a specimen is made of a transparent material, a slit image of reflected light reflected by a top surface of the specimen.
Figure 6:
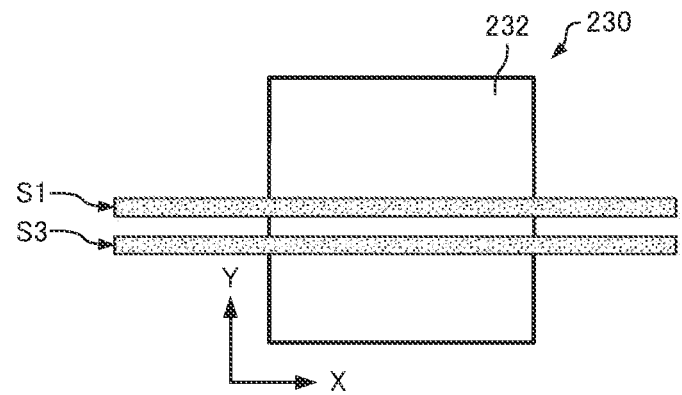
FIG. 6 is a diagram for explaining, when the specimen is made of the transparent material, a technique of identifying a slit image of reflected light reflected by a top surface of the specimen.

FIGS. 5 and 6 are diagrams for explaining a technique of identifying, when the specimen 2 is made of a transparent material, a slit image of the reflected light reflected by the top surface 2a of the specimen 2.

As illustrated in FIG. 5, when the specimen 2 is made of a transparent material that transmits the light emitted from the light source 210, such as a glass substrate, the light from the light source 210 is reflected by the top surface 2a of the specimen 2, while being transmitted by the specimen 2 to be reflected also by a back surface 2b of the specimen 2. Consequently, in the imaging element 230, the slit image S1 of the reflected light reflected by the top surface 2a of the specimen 2 and a slit image S3 of the reflected light reflected by the back surface 2b of the specimen 2 are detected. As a result, it is required to identify which one of the two slit images (the slit image S1 and the slit image S3) is the slit image S1 of the reflected light reflected by the top surface 2a of the specimen 2.

As illustrated in FIG. 5, the optical axis of the reflected light reflected by the top surface 2a of the specimen 2 corresponds to the optical axis L2, and an optical axis of the reflected light reflected by the top surface 2a of the specimen 2 corresponds to an optical axis L6. As illustrated in FIGS. 5 and 6, on the detection surface 232 of the imaging element 230, the slit image S1 of the reflected light reflected by the top surface 2a of the specimen 2 is constantly located in a positive Y-axis direction with respect to the slit image S3 of the reflected light reflected by the back surface 2b of the specimen 2. In other words, the Y-coordinate of the center of the slit image S1 is larger than a Y-coordinate of a center of the slit image S3. Consequently, when the two slit images are detected by the imaging element 230, the one of the two slit images having the larger Y-coordinate is the slit image S1 of the reflected light reflected by the top surface 2a of the specimen 2.

Figure 7:
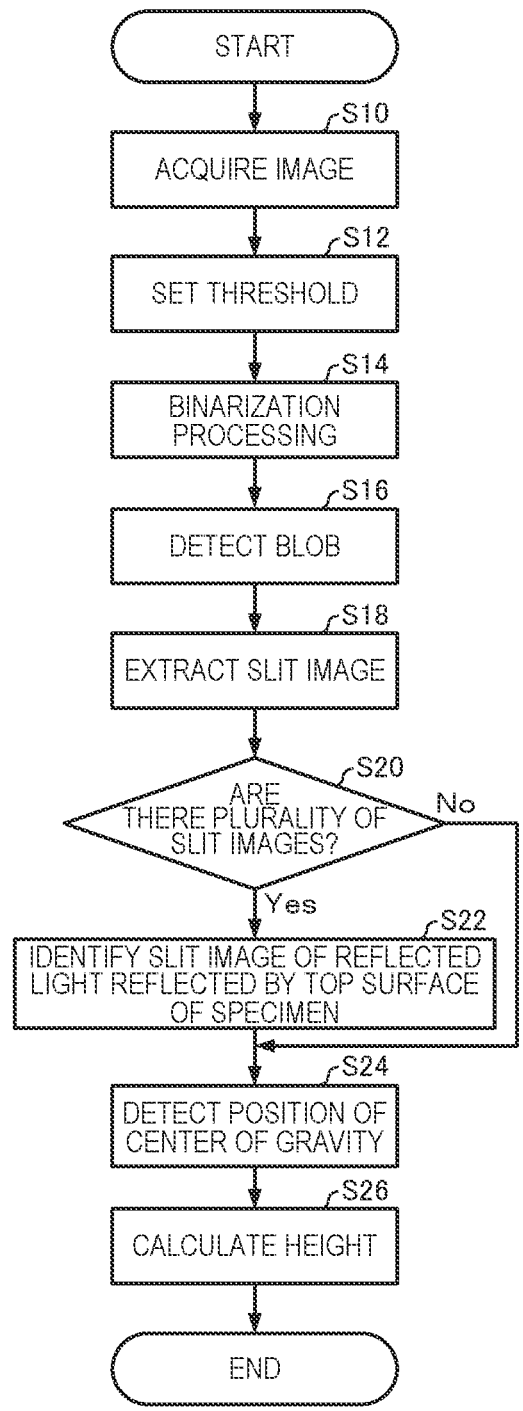
FIG. 7 is a flow chart illustrating an example of processing in an arithmetic unit.

FIG. 7 is a flow chart illustrating an example of processing in the arithmetic unit 240.

The arithmetic unit 240 acquires an image photographed by the imaging element 230 (S10). Then, the arithmetic unit 240 sets a threshold for binarization processing (S12). The threshold is set to a value which allows the slit image S1 and the slit image S3 to be separated from each other. In the processing of setting the threshold, it may be possible to, e.g., set the threshold to a preset value or set the threshold by using a known threshold determination method.

Then, the arithmetic unit 240 performs the binarization processing on the acquired image based on the set threshold (S14). Note that, after the binarization processing, the arithmetic unit 240 may also perform filter processing for accentuating the image after subjected to the binarization processing.

Next, the arithmetic unit 240 detects blobs in the image after subjected to the binarization processing (S16) and extracts, as the slit images, the blobs each occupying an area equal to or larger than a predetermined area set in advance (S18). Thus, it is possible to detect the slit images.

Then, the arithmetic unit 240 determines whether or not the plurality of slit images are detected (S20).

Figure 8:
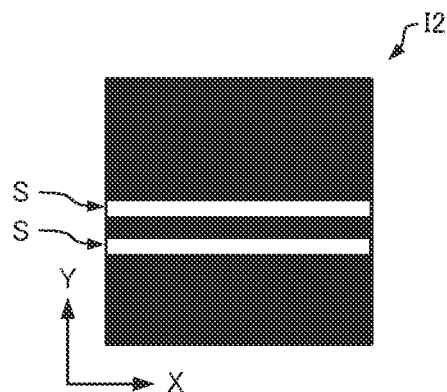
FIG. 8 is a diagram schematically illustrating a binarized image.

FIG. 8 is a diagram schematically illustrating a binarized image 12. As illustrated in FIG. 8, the image 12 includes two blobs, i.e., two slit images S. Accordingly, the arithmetic unit 240 determines that the plurality of slit images S are detected.

When determining that the plurality of slit images are detected (Yes in S20), the arithmetic unit 240 specifies, from among the plurality of slit images S, the slit image S1 of the reflected light reflected by the top surface 2a of the specimen 2 based on respective positions of the plurality of slit images on the detection surface 232 of the imaging element 230 (S22).

Figure 9:
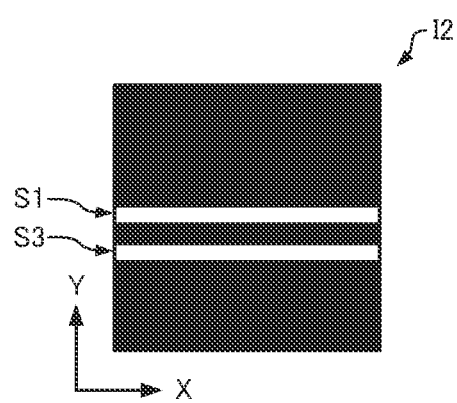
FIG. 9 is a diagram schematically illustrating a binarized image.

Specifically, as illustrated in FIG. 9, the one of the two slit images S over the image 12 having the larger Y-coordinate is determined to be the slit image S1 of the reflected light reflected by the top surface 2a of the specimen 2.

Then, the arithmetic unit 240 detects on the image 12 the position of the center (center of gravity) of the slit image S1 of the reflected light reflected by the top surface 2a of the specimen 2 (S24).

Then, the arithmetic unit 240 determines the height of the top surface 2a of the specimen 2 based on the position of the slit image S1 of the reflected light reflected by the top surface 2a of the specimen 2 on the detection surface 232 of the imaging element 230 (S26). The height of the top surface 2a of the specimen 2 can be determined by using Expression (2) shown above.

It is assumed that the displacement amount $\Delta S$ between the respective positions of the slit images is an amount of displacement of the height of the top surface 2a of the specimen 2 from, e.g., a height of a reference marker provided on the specimen stage 130 to indicate a reference height position. Accordingly, for example, a position of a center (center of gravity) of a slit image of reflected light reflected by a top surface of the reference marker on the detection surface 232 of the imaging element 230 is measured in advance, and coordinates of the center of gravity of the slit image are stored in the storage device of the arithmetic unit 240.

In processing of determining the height of the top surface 2a of the specimen 2, a distance in the Y-axis direction between the position of the center of the slit image S1 determined in Step S24 and the position of the center of the slit image of the reflected light reflected by the top surface of the reference marker is determined to determine the displacement amount $\Delta S$. Then, the determined displacement amount $\Delta S$ is substituted in Expression (2) to determine a height variation $\Delta H$.

When determining that the plurality of slit images are not detected, i.e., only one slit image is detected (No in S20), the arithmetic unit 240 detects the position of the center of the slit image (S24) and determines the height of the top surface 2a of the specimen 2 (S26).

Through the foregoing processing, it is possible to determine the height of the top surface 2a of the specimen 2.

1.3. Control Unit

The control unit 300 performs processing such as processing of controlling each of the constituent units of the electro-optical system 100 and processing of controlling the specimen stage 130. For example, the control unit 300 includes a processor such as a CPU and a storage device including a RAM, a ROM, and the like. In the storage device, programs for performing various control processing and data are stored. A function of the control unit 300 can be implemented through execution of the programs by the processor.

A control signal for controlling the objective lens 118 generated by the control unit 300 is converted by a D/A converter 320 to an analog signal, which is supplied to the objective lens 118. A control signal for controlling the positioning deflector 120 generated by the control unit 300 is converted by a D/A converter 322 to the analog signal, which is supplied to the positioning deflector 120.

2. Operation of Electron Beam Lithography Apparatus

The electron beam lithography apparatus 1000 combines deflection of the electron beam and movement of the specimen 2 to draw a figure on the top surface 2a of the specimen 2. Specifically, the control unit 300 repeats drawing in a range (field) in which the electron beam is deflected and movement of the specimen 2 to a subsequent field to draw the figure on the top surface 2a of the specimen 2.

When the height of the top surface 2a of the specimen 2 varies, to precisely draw the figure, it is required to measure the height of the top surface 2a of the specimen 2 on each movement between the fields and adjust a focus of the objective lens 118 and a deflection angle of the electron beam in the positioning deflector 120 based on a variation in the height of the top surface 2a of the specimen 2.

Accordingly, in the electron beam lithography apparatus 1000, on each movement between the fields, the height measuring device 200 measures the height of the top surface 2a of the specimen 2 and, on each movement between the fields, the control unit 300 acquires information on the height of the top surface 2a of the specimen 2 from the height measuring device 200 and corrects the focus of the objective lens 118 and the deflection angle of the electron beam in the positioning deflector 120.

Specifically, when the control unit 300 operates the specimen stage 130 to move the specimen 2, the height measuring device 200 measures the height of the top surface 2a of the specimen 2. The control unit 300 acquires the information on the height of the top surface 2a of the specimen 2 from the height measuring device 200 and corrects the focus of the objective lens 118 and the deflection angle of the electron beam in the positioning deflector 120. Then, the control unit 300 performs drawing using the electron beam on the top surface 2a of the specimen 2.

Subsequently, when the control unit 300 operates the specimen stage 130 to move the specimen 2, in a similar manner, the height measuring device 200 measures the height of the top surface 2a of the specimen 2, and the control unit 300 corrects the focus of the objective lens 118 and the deflection angle of the electron beam in the positioning deflector 120 and performs drawing.

In the electron beam lithography apparatus 1000, through the repetition of the processing described above by the control unit 300 and the height measuring device 200, a pattern is drawn on the top surface 2a of the specimen 2.

3. Functions/Effects

In the height measuring device 200, when the plurality of slit images are detected by the imaging element 230, the arithmetic unit 240 performs the processing of identifying, from among the plurality of slit images, the slit image of the reflected light reflected by the top surface 2a of the specimen 2 based on the respective positions of the plurality of slit images on the detection surface 232 of the imaging element 230 and the processing of determining the height of the top surface 2a of the specimen 2 based on the position of the slit image of the reflected light reflected by the top surface 2a of the specimen 2 on the detection surface 232. Thus, in the height measuring device 200, it is possible to identify the slit image of the reflected light reflected by the top surface 2a of the specimen 2. This prevents the height from being determined based on the slit image of the light reflected by the back surface 2b of the specimen 2 and allows the height of the top surface 2a of the specimen 2 to be accurately measured.

In the height measuring device 200, when the height of the top surface 2a of the specimen 2 increases as a coordinate (Y-coordinate) in a predetermined direction (Y-axis direction) of each of the slit images increases on the detection surface 232 of the imaging element 230, in the processing of identifying the slit image of the reflected light reflected by the top surface 2a of the specimen 2, the slit image having the largest coordinate (Y-coordinate) in the predetermined direction among the plurality of slit images detected by the imaging element 230 is determined to be the slit image of the reflected light reflected by the top surface 2a of the specimen 2. Consequently, in the height measuring device 200, it is possible to easily identify the slit image of the reflected light reflected by the top surface 2a of the specimen 2 from among the plurality of slit images in the image photographed by the imaging element 230.

In the height measuring device 200, the light source 210 is the light emitting diode. Accordingly, in the height measuring device 200, it is possible to prevent the reflected light emitted from the light source 210 and reflected by the top surface 2a of the specimen 2 and the reflected light reflected by the back surface 2b of the specimen 2 from interfering with each other.

For example, when the light source 210 is a laser diode, the reflected light reflected by the top surface 2a of the specimen 2 and the reflected light reflected by the back surface 2b of the specimen 2 may interfere with each other. When the reflected light beams interfere with each other, an interference fringe occurs, and the slit images cannot clearly be photographed by the imaging element 230. By contrast, when the light source 210 is the light emitting diode, no interference occurs between the reflected light beams. Consequently, in the height measuring device 200, the slit images can clearly be photographed without being affected by the interference fringe.

In addition, in the height measuring device 200, since the light source 210 is the light emitting diode, stability is higher than when the light source 210 is a halogen lamp or the like, and accordingly a response is rapid. Consequently, in the height measuring device 200, the light source 210 can be turned ON only when, e.g., the slit images are photographed by the imaging element 230.

For example, in a case where the light source 210 is the halogen lamp having a low response speed or the like, when the light source 210 is turned ON/OFF every time height measurement is performed, the height measurement takes time. Meanwhile, in a state where the light source 210 is constantly ON, when a specimen image is observed using a reflected electron detector or the like in the electron beam lithography apparatus 1000, there is a risk that the reflected electron detector may detect the light from the light source 210. By contrast, in the height measuring device 200, the light source 210 is the light emitting diode having a high response speed, and therefore such a problem does not arise.

The height measuring method according to the present embodiment includes the steps of forming a slit image on the top surface 2a of the specimen 2 by using the light source 210 that emits light in a direction oblique to the top surface 2a of the specimen 2 and the slit 222 that shapes the light from the light source 210, detecting the reflected light reflected by the specimen 2 by using the imaging element 230, identifying, when a plurality of the slit images are detected by the imaging element 230, the slit image of the reflected light reflected by the top surface 2a of the specimen 2 from among the plurality of slit images based on respective positions of the plurality of slit images on the detection surface 232 of the imaging element 230, and determining the height of the top surface 2a of the specimen 2 based on the position of the slit image of the reflected light reflected by the top surface 2a of the specimen 2 on the detection surface 232. This allows the height of the top surface 2a of the specimen 2 to be accurately determined.

4. Modifications

Note that the invention is not limited to the embodiments described above, and can variously be modified within the scope of the invention.

In the embodiments described above, the electron beam lithography apparatus 1000 has been described as an example of the charged particle beam apparatus according to the invention. However, the charged particle beam apparatus according to the invention is not limited to the electron beam lithography apparatus 1000, and may also be a scanning electron microscope (SEM), a focused ion beam apparatus (FIB), or the like. For example, in the scanning electron microscope including the height measuring device 200, the focus of the objective lens can accurately be adjusted based on the height of the top surface of the specimen measured by the height measuring device 200.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A height measuring device comprising:
   a light source that emits light in a direction oblique to a top surface of a specimen such that the specimen transmits the light emitted from the light source;
   a slit that shapes the light from the light source to form a slit image on the specimen;
   an imaging element that detects reflected light reflected by the specimen; and
   an arithmetic unit that determines a height of the top surface of the specimen based on a result of detection of the slit image by the imaging element,
   the arithmetic unit performing processing of:
      acquiring an image photographed by the imaging element;
      performing binarization processing on the acquired image;
      detecting blobs in the binarized image;
      extracting blobs each occupying an area equal to or larger than a predetermined area as slit images from among the detected blobs;
      determining whether a plurality of slit images are detected based on the extracting;
      identifying, when the arithmetic unit has determined that the plurality of slit images are detected by the imaging element, a slit image of the reflected light reflected by the top surface of the specimen from among the plurality of slit images based on respective positions of the plurality of slit images on a detection surface of the imaging element with a first slit image having a largest coordinate in a predetermined direction on the detection surface from among the plurality of slit images being identified as the slit image of the reflected light reflected by the top surface of the specimen, and a second slit image among the plurality of slit images other than the first slit image being identified as a slit image of a reflected light reflected by a back surface of the specimen;
      determining the height of the top surface of the specimen based on the position of the slit image of the reflected light reflected by the top surface of the specimen on the detection surface; and
      determining, when the arithmetic unit has determined that the plurality of slit images are not detected by the imaging element, the height of the top surface of the specimen based on the position of a detected slit image.

2. The height measuring device according to claim 1, wherein the light source is a light emitting diode.

3. A charged particle beam apparatus comprising the height measuring device according to claim 1.

4. A height measuring method comprising:
   using a light source that emits light in a direction oblique to the top surface of the specimen such that the specimen transmits the light emitted from the light source and a slit that shapes the light from the light source to obtain an image on a top surface of a specimen;
   acquiring the image by photographing the top surface of the specimen with an imaging element;
   performing binarization processing on the acquired image;
   detecting blobs in the binarized image;
   extracting blobs each occupying an area equal to or larger than a predetermined area as slit images from among the detected blobs;
   determining whether a plurality of slit images are detected based on the extracting;
   identifying, when the plurality of slit images are detected by the imaging element, a slit image of the reflected light reflected by the top surface of the specimen from among the plurality of slit images based on respective positions of the plurality of slit images on a detection surface of the imaging element with a first slit image having a largest coordinate in a predetermined direction on the detection surface from among the plurality of slit images being identified as the slit image of the reflected light reflected by the top surface of the specimen and a second slit image among the plurality of images other than the first slit image being a slit image of a reflected light reflected by a back surface of the specimen;
   determining a height of the top surface of the specimen based on the position of the slit image of the reflected light reflected by the top surface of the specimen on the detection surface; and
   determining, when the plurality of slit images are not detected by the imaging element, the height of the top surface of the specimen based on the position of a detected slit image.

* * * * *